US006334505B1

(12) United States Patent
Li

(10) Patent No.: US 6,334,505 B1
(45) Date of Patent: Jan. 1, 2002

(54) OPTIMUM EDGES FOR SPEAKERS AND MUSICAL INSTRUMENTS

(76) Inventor: Ming-Chiang Li, 11415 Bayard Dr., Mitchellville, MD (US) 20721

(*) Notice: Subject to any disclaimer, the term of this patent is extended or adjusted under 35 U.S.C. 154(b) by 0 days.

(21) Appl. No.: 08/106,541

(22) Filed: Aug. 16, 1993

Related U.S. Application Data

(63) Continuation-in-part of application No. 07/612,997, filed on Nov. 15, 1990, now abandoned.

(51) Int. Cl.[7] .......... H05K 5/00; G10K 13/00; G10K 11/00

(52) U.S. Cl. .......... 181/192; 181/152; 181/159; 181/177

(58) Field of Search .......... 181/175, 177, 181/192, 159, 152, 156, 151, 155, 191; 84/387 R, 395, 382, 380 R, 385 R; 381/156

(56) References Cited

U.S. PATENT DOCUMENTS

| | | | | | |
|---|---|---|---|---|---|
| 811,877 | A | * | 2/1906 | Senné | 181/192 |
| 915,013 | A | * | 3/1909 | Beécroft | 181/192 |
| 1,588,390 | A | * | 6/1926 | Scchy | 84/387 |
| 1,713,207 | A | * | 5/1929 | Young et al. | 181/192 |
| 1,763,336 | A | * | 6/1930 | Wilder | 84/387 |
| 1,786,279 | A | * | 12/1930 | Wolff | 181/155 |
| 2,643,727 | A | * | 6/1953 | Leon | 181/155 |
| 2,900,040 | A | * | 8/1959 | Novak | 181/152 |
| 4,378,471 | A | * | 3/1983 | Shintaka | 181/177 |
| 4,739,860 | A | * | 4/1988 | Kobayashi et al. | 181/151 |
| 5,103,482 | A | * | 4/1992 | Fabri-Conti | 181/159 |
| 5,220,608 | A | * | 6/1993 | Pfister | 181/191 |

FOREIGN PATENT DOCUMENTS

| | | | | |
|---|---|---|---|---|
| DE | 2041906 | * | 8/1970 | 181/155 |
| JP | 0052994 | * | 5/1981 | 381/156 |
| SU | 1190438 | * | 11/1985 | 343/772 |

* cited by examiner

*Primary Examiner*—David M. Gray

(57) ABSTRACT

The invention presents a design of optimum edges for antennas of loudspeakers, microphones, hydro-speakers, hydro-phones, brass and wind instruments, and ultrasonic transducers. These edges have a serrated-roll shape, and enhance the acoustical field strength uniformity. Loudspeakers, hydro-speakers, and ultrasonic transducers will become more effective in radiating acoustical power. The quality of these apparatuses are enriched. The musical tone emitted by loudspeakers, brass and wind instruments becomes more smooth, mellow, rich, clean, and elegant.

16 Claims, 11 Drawing Sheets

190

200

300

400

700

OPTIMUM EDGES FOR SPEAKERS AND MUSICAL INSTRUMENTS

This is a Continuation-In-Part of the pending application: Appn. Number: 07/612,997 Filing Date: Nov. 15, 1990 now abandoned.

TECHNICAL FIELD OF THE INVENTION

This invention is on improving acoustical antennas for enhancing the performance of loudspeakers, microphones, hydro-speakers, hydro-phones, brass and wind instruments, and ultrasonic transducers. The invention will reduce spatial irregularity of sound created by edge diffraction and enrich the quality of these apparatuses.

BACKGROUND OF THE INVENTION

Loudspeakers, microphones, hydro-speakers, hydro-phones, brass and wind instruments, and ultrasonic transducers are apparatuses all of which we will refer to as acousducers. They may have different designs, shapes, and drivers, but they all have an opening which interacts directly with surrounding medium, that can either be air, liquid, or solid. Openings are usually the mouths or end surfaces of tubes, horns, cones, and wedges which are a part of any acousducer. Loudspeakers, microphones, hydro-speakers, and hydro-phones all have these mouths; likewise the brass and wind instruments, as well as certain string instruments, for example, the Chinese two string instruments. Some ultrasonic transducers have a radiating end surface as well.

Mechanical parts associated with the mouth or end surface of an acousducer are mainly responsible of radiating or receiving sounds. The whole structure of mechanical parts is special and directly affects the spatial distribution of the sounds radiated to or selection of the sounds received from the environment, thus it plays the role of an antenna for the acousducer. We will refer to the whole mechanical parts as the acoustical antenna. Conventionally, the acousducers are treated as vibrating objects. The emphasis of a conventional treatment is on the quality of frequency responses for these acousducers. The spatial radiation pattern of sounds generated or received by these acousducers is often not considered. This restricted view has prevented us from gaining deeper understanding of the acousducers.

The finite size of a mouth or end surface creates appreciable side lobes and spatial irregularities in sound generation or reception. The irregularities are all resulted from the edge diffraction of the acoustical antenna opening and lead to performance degradation of acousducers, because edge diffraction spreads sounds toward or receiving sounds from undesirable directions.

In light of the above, there is a need in the art to minimize edge diffractions of acoustical antennas. The loudspeakers, hydro-speakers, and ultrasonic transducers will then become more effective in radiating acoustical power. The microphones, hydro-phones, and ultrasonic transducers will be more effective in selecting sounds for reception. The quality of brass and wind instruments and loudspeakers will be enriched. The tone emitted by them becomes more smooth, mellow, rich, clean, and elegant.

THEORY

An acoustical antenna projects sound waves through its mouth or end surface onto an aperture at the surrounding mediums. The wave field at each point of the aperture as defined by the projection becomes a new source of a secondary spherical wave and is known as Huygens' wavelet. The envelope of all Huygens' wavelets emanating from the antenna aperture at any instant of time is then used to describe the transmitting wave from the antenna at a later time. The above mechanism is known as the famed Huygens-Fresnel Principle. Mathematically, this principle can be represented by the Rayleigh-Sommerfeld diffraction formula which is a Fourier type integration.

The aperture of any antenna must be finite in size. This restriction imposes a abrupt "rectangular" window on the Rayleigh-Sommerfeld diffraction formula for an untreated antenna. It is well known in Fourier analysis that a rectangular window leads to high side lobes. These side lobes can be properly reduced by employing smooth tapered windows before evaluating the Fourier transformation. The edge treatment of an antenna to reduce its edge diffractions corresponds to an imposition of a smooth tapered window onto the Rayleigh-Sommerfeld diffraction formula. The serrated and rolled edge treatments differ in methods of tapering. The former is restricted to the magnitude tapering of the wave field at the aperture of an antenna, and the latter is mainly confined to phase tapering with little controls on the magnitude. The wave field has two independent components -- magnitude and phase. Any abrupt change in either component will lead to high side lobes and edge diffractions. Both serrated and rolled edge treatments are only restricted to one respective component, while neglecting the other. The abrupt change cannot be optimally removed with either of these two methods. The present invention treats both components simultaneously; therefore leading to much better side lobe reduction and a smaller size for the added skirt.

SUMMARY OF THE INVENTION

Embodiments of the present invention advantageously satisfy the above identified need in the art, and provide acoustical antennas which are low in edge diffractions and side lobes. In particular, an embodiment of an inventive acoustical antenna comprises a body, which further comprises a skirt, and a serrated-roll edge.

In a preferred embodiment of the present invention, the antenna body is tightly jointed with the body or the supporting structure of its hosting acousducer. Irregularities of the antenna body and the joint to its host will create internal reflections, which disturbs the sound generated by the acousducer. In a further preferred embodiment, the antenna body and the joint all are smooth and continuous. Any unavoidable irregularities should be kept as minimum as possible.

BRIEF DESCRIPTION OF THE DRAWINGS

A complete understanding of the present invention may be gained by considering the following detailed description in conjunction with the accompanying drawing, in which.

DETAILED DESCRIPTION

Figure 1:
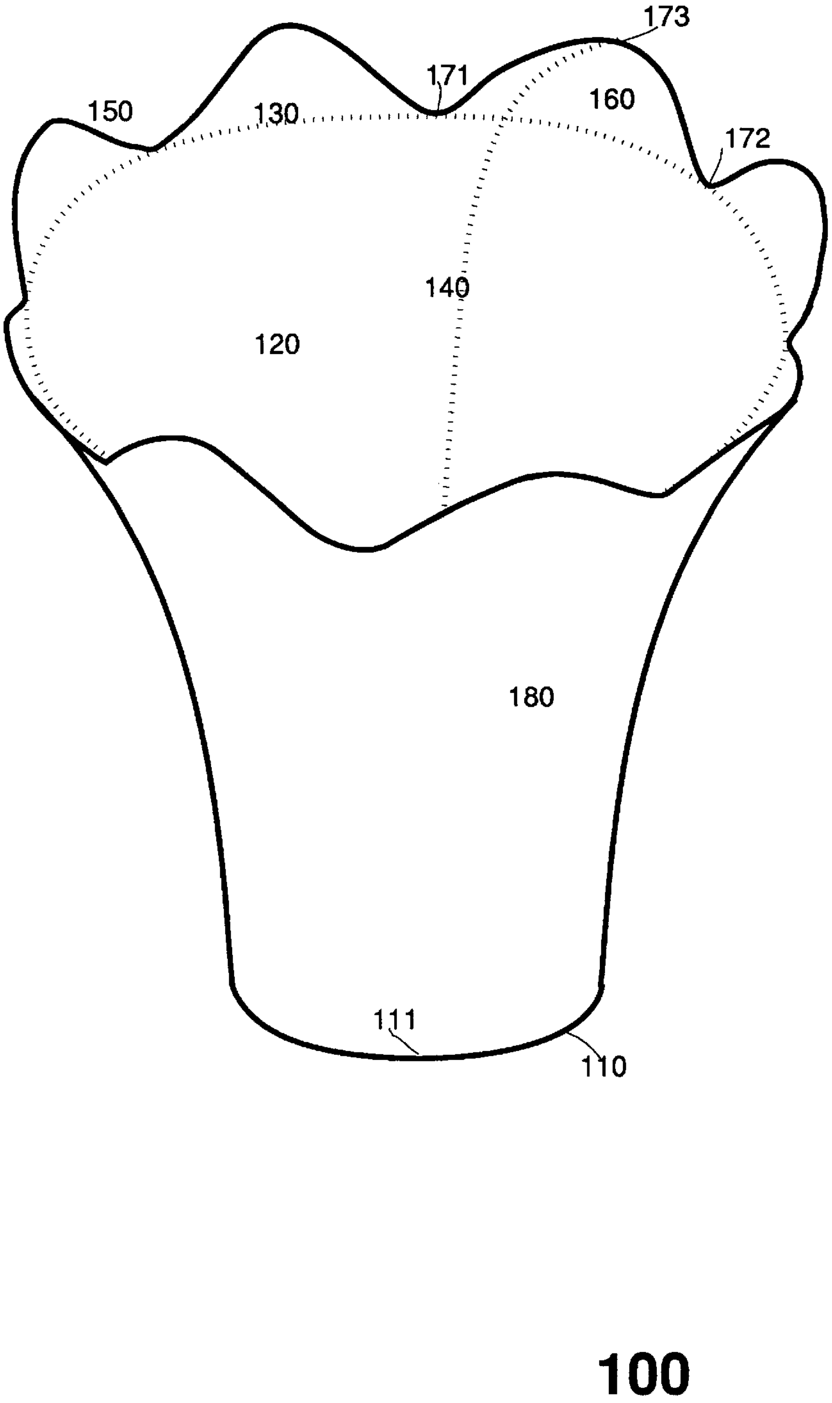
FIG. 1 shows a diagram of a skirt with a serrated-roll edge for use in fabricating embodiments of the present invention.

FIG. 1 shows embodiment 100 of a skirt 100 with a serrated-roll edge, which is fabricated according to the present invention. The skirt is rigid-walled and cylindrically symmetric. It receives acoustical powers from the lower input throat 110 and radiates sounds from the upper output opening 120, or vice versa. The interior rim 111 of the lower throat 110 and the circumference 130 of the upper opening cross section are all circular. The interior wall of the skirt 100 is smoothly finished and continuously formed. The interior wall is smoothly and continuously rolled back, as the skirt opens gradually from its receiving throat 110 to its radiating opening 120. Any radian curve 140 along the interior well is smooth and continuous.

The perimeter curve 150 is smooth and continuous. It means that the radius of curvature and a certain number of its derivatives at every point on the perimeter curve 150 are continuous. Each serration of the edge tapers down slowly and may revert to a scalloped shape, as the serration 160 progresses gradually from the valley points 171 and 172 to the tip 173. The exterior wall 180 of the skirt 100 may be finished according to the designers artistic taste.

As those of ordinary skill in the art should readily appreciate that the number of serration, the roll back rate, the tapering curvature, the depth of serration and the size of the skirt are determined by the requirements on the desired width and shape of the main lobe; the acceptable level of side lobes; the allowance of the spatial sound irregularity; and the imposed restrictions on the physical dimensions of the entire skirt. The process from a set of requirements to the objective skirt is an optimum process, which requires a theoretical calculation. The calculation is based on Rayleigh-Sommerfield diffraction formula and variational principles which are well known to those of ordinary skill in the art. The resulted calculations leads to the number of serration, the roll back rate, the tapering curvature, the depth of serration and the size of the skirt. In the engineering implementation of the serrated-roll skirt, the smoothness, the continuity, the rollback rate, the tapering curvature, and the depth of serration have to be strictly maintained and the deviation level has to be kept as low as possible. As those of ordinary skill in the art will readily appreciate, the interior wall of the skirt must be rigid and stiff to assure the perfection of the implementation. Sometimes, imposed physical restrictions may prevent a perfect implementation of the present invention, then precautions have to be taken to minimize the undesirable variations as much as possible.

Figure 1A:
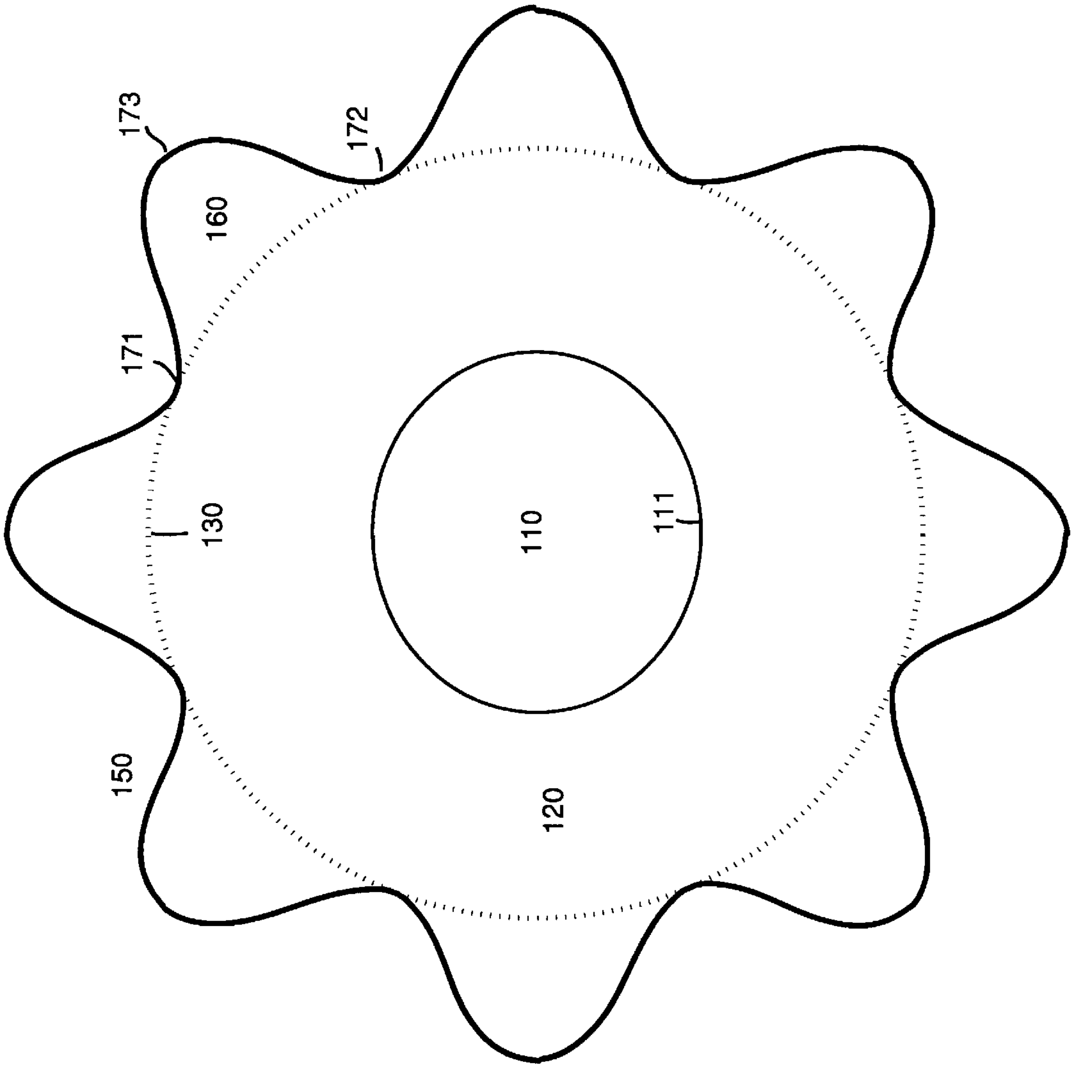
FIG. 1*a* the skirt in FIG. 1 as viewed from the top.

FIG. 1*a* the top view of embodiment 100 in FIG. 1. The circular interior rim 111 of the lower throat 110 and the circular circumference of the upper opening cross section 130 assure the smoothness and continuity of the skirt.

Figure 1B:
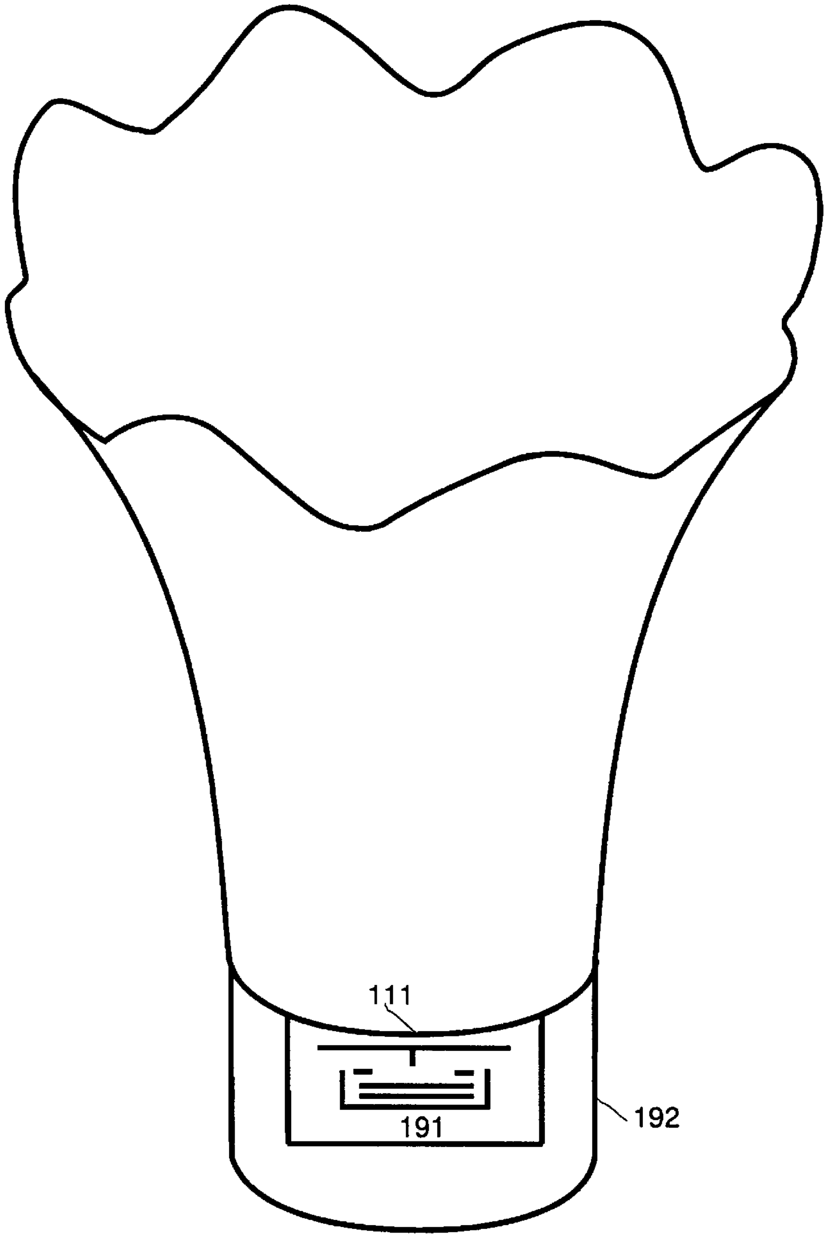
FIG. 1*b* shows an embodiment of a transducer with a serrated-roll edge skirt which is fabricated in accordance with the present invention.

FIG. 1*b* shows embodiment 190 of a transducer with a serrated-roll edge skirt 100 which is fabricated in accordance with the present invention. The transducer may be a loudspeaker, microphone, hydro-speaker, hydro-phone, or an ultrasonic transducer. The driver 191, which is well known to those of ordinary skill in the art, can be crystal, electric, magnetic, ribbon, or others. The cover 192 is just for the protection of the driver 191.

Figure 2:
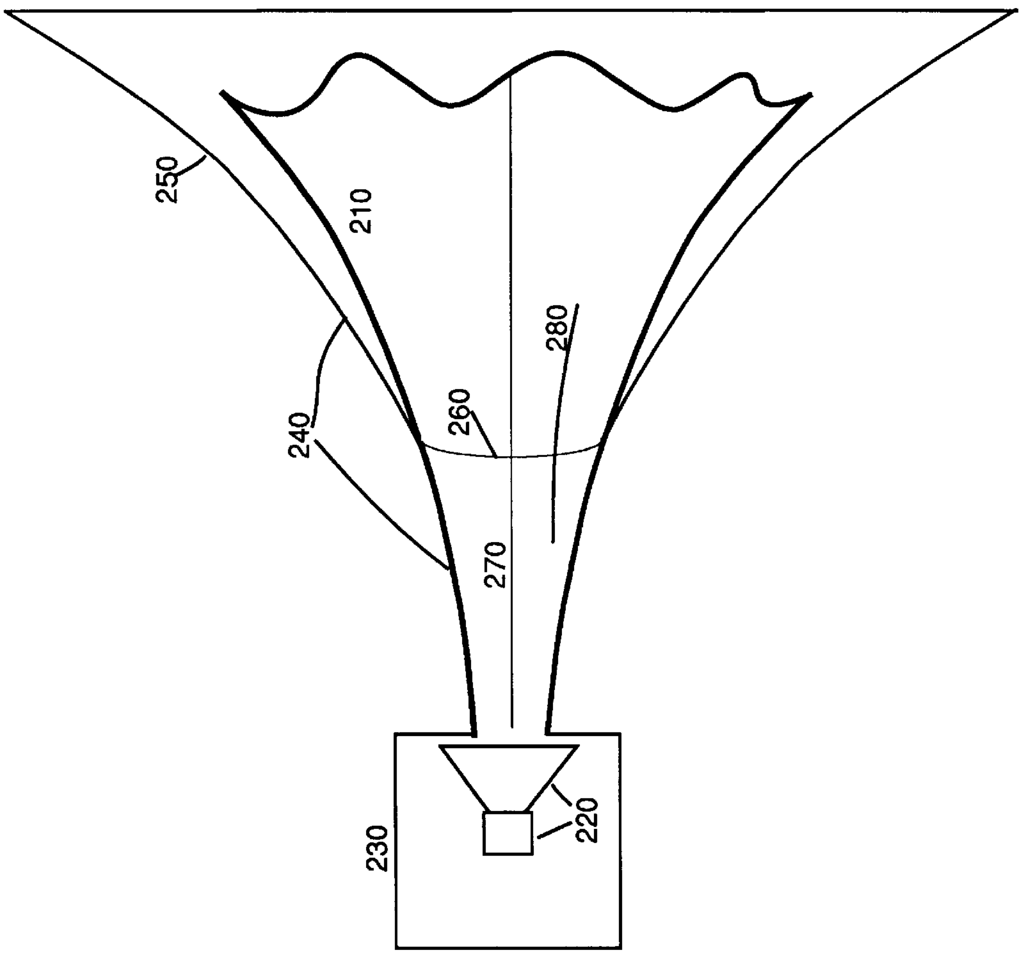
FIG. 2 shows an embodiment of a loudspeaker with a serrated-roll edge skirt which is fabricated in accordance with the present invention.

FIG. 2 shows embodiment 200 of a loudspeaker with a serrated-roll edge skirt 210 which is fabricated in accordance with the present invention. The original loudspeaker is comprised of the driver 220, enclosure 230, and horn 240 which are well known to those of ordinary skill in the art. The original skirt 250 is removed by a crosscut 260 which is perpendicular to the skirt axis 270. The serrated-roll edge skirt 210 joints to the original skirt at the cut 260 smoothly and continuously. It means that the radii of curvature and a certain number of their derivatives at both sides of the cut 260 are equal to assure any radian curve 280 crosscutting the joint and along the interior wall remain smooth and continuous.

Figure 2A:
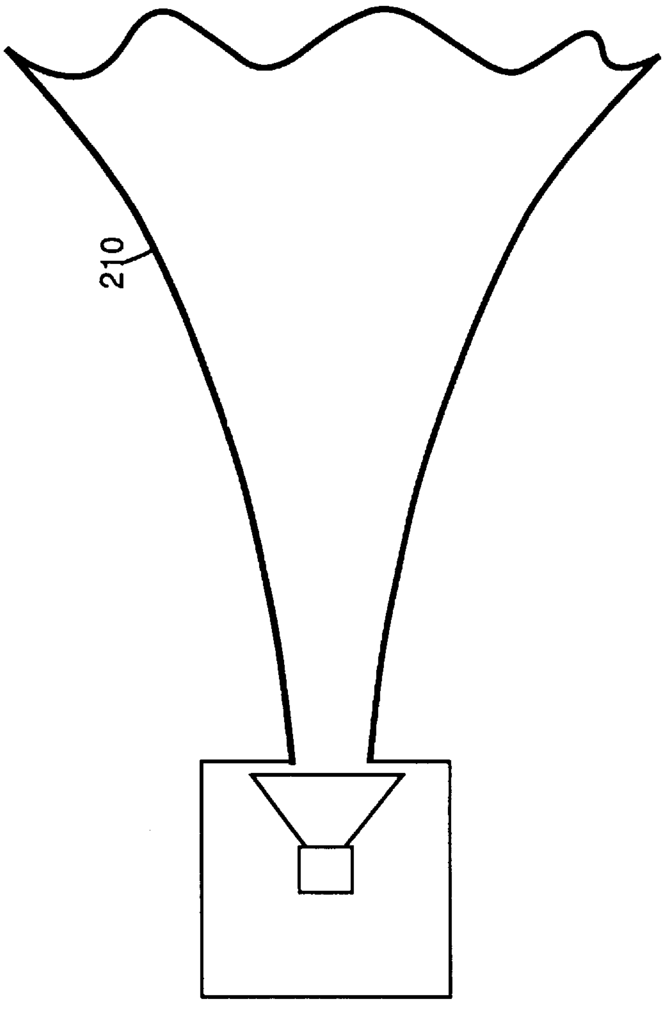
FIG. 2*a* the embodiment of the loudspeaker in FIG. 2.

FIG. 2*a* the embodiment 200 of an invented loudspeaker in FIG. 2 with the original skirt 250 removed. The steps described above are mainly for the illustration purpose. Any one with ordinary skills would appreciate that, for small loudspeakers with serrated-roll edges, it is easier and cost less in manufacturing each of these loudspeakers as a whole unit rather than through steps outlined above. The theoretical analysis of conventional speaker skirts are based on a quasi-one-dimensional model of sound propagation in a duct of variable cross-sectional area, which is cylindrically symmetric and angle independent. Conventional skirts, which were constructed under the guidance of these analysis, have circular cross sections, hence the original skirt 250 is often circular. The sound propagation in a duct is governed by Webster's wave equation with the assumption that the wave is uniform over the cross section area. Webster's wave equation is no longer applicable for the serrated skirt, hence the wave is no longer uniform over the cross section area of the skirt with serration.

Figure 3:
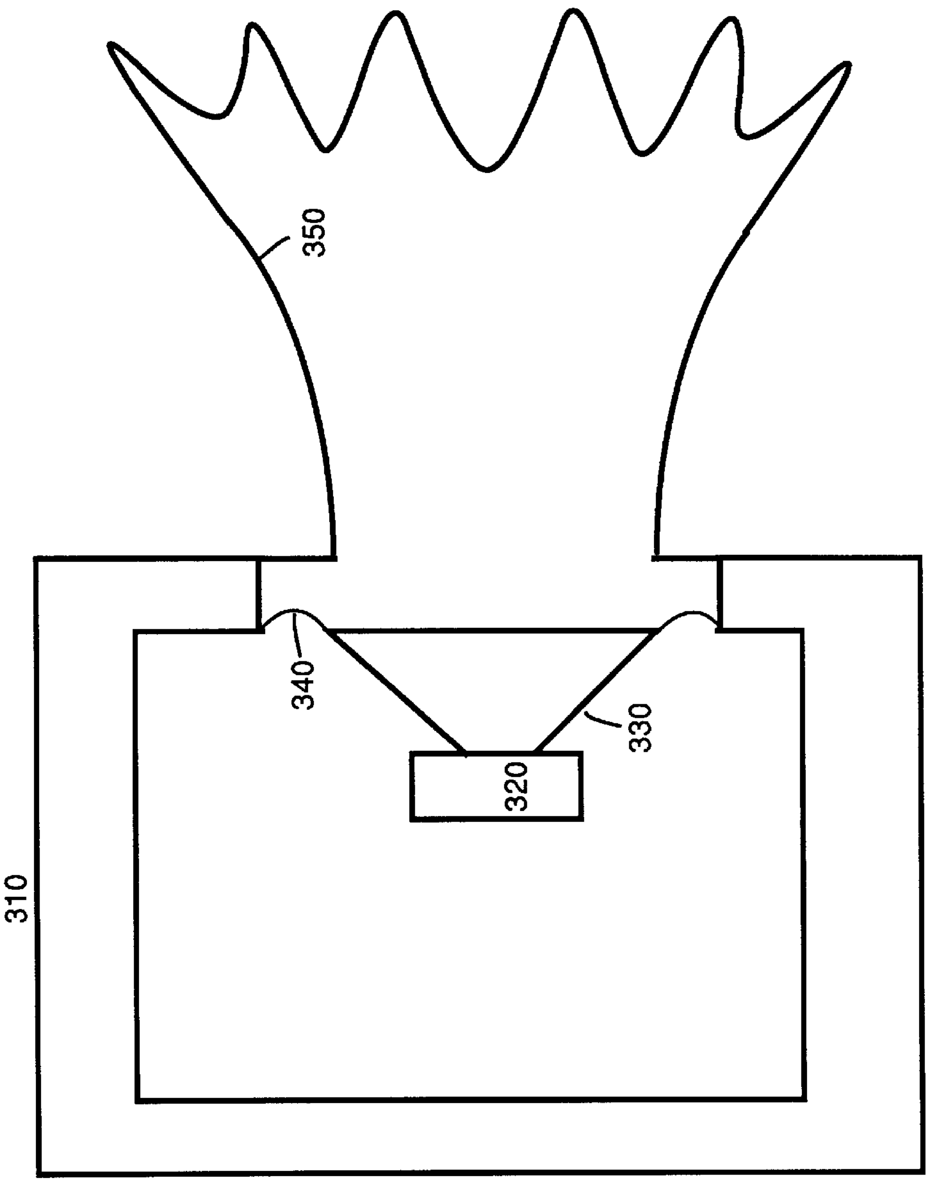
FIG. 3 shows an embodiment of another loudspeaker with a serrated-roll edge skirt which is fabricated in accordance with the present invention.

FIG. 3 shows embodiment 300 of a loudspeaker with a serrated-roll edge skirt which is fabricated in accordance with the present invention. The enclosure 310, the driver 320, the speaker cone 330 and the soft suspension ring 340 are well known to those of ordinary skill in the art. In accordance with the present invention, the length of the rigid-walled skirt 350 should be relatively shorter than that of a conventional horn with a same size opening. The skirt 350 is firmly mounted on the enclosure 310. The throat of the skirt 350 should be nearly equal to the opening of the speaker cone 330, but less than the inner circle of the inner rim of soft suspension ring 340. The clearance between the skirt 350 and the speaker cone should be sufficient for the possible speaker cone 330 excursion. The tangents of the radian curves at the interior throat rim of the skirt 350 should be all parallel to the axis of the skirt 350.

Figure 3A:
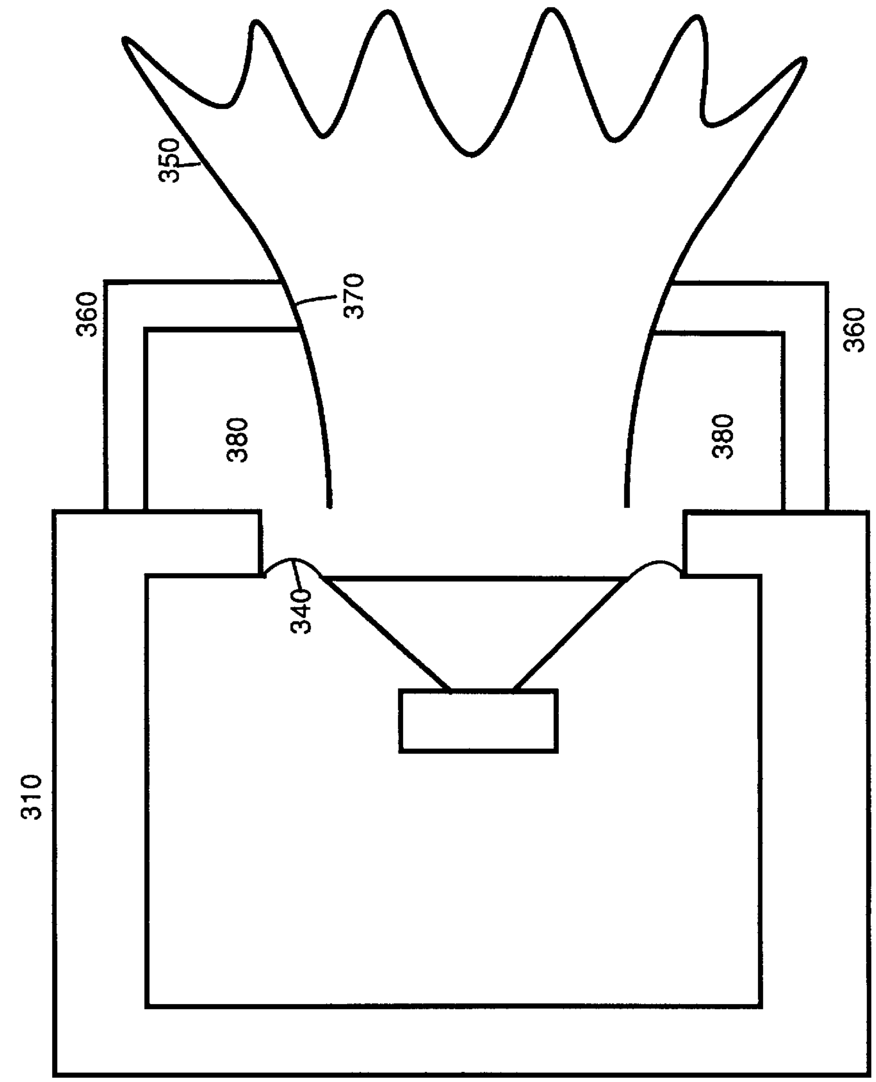
FIG. 3*a* shows a preferred embodiment of the loudspeaker with a serrated-roll edge skirt.

In a preferred embodiment of the present invention, the serrated-roll skirt 350 of a loudspeaker 300 is mounted on the enclosure 310 through a specially designed structure 360 as in FIG. 3*a*. The skirt 350 is firmly fastened to the structure 360 at the skirt's waist 370. The hallowed space 380 as surrounded by the enclosure 310, the suspension ring 340, the skirt 350 and the structure 360 is filled with acoustically absorptive material to remove the diffracted sound from the suspension ring 340, from the edge of the enclosure's opening, and from the outer rim of the skirt's throat.

Figure 4:
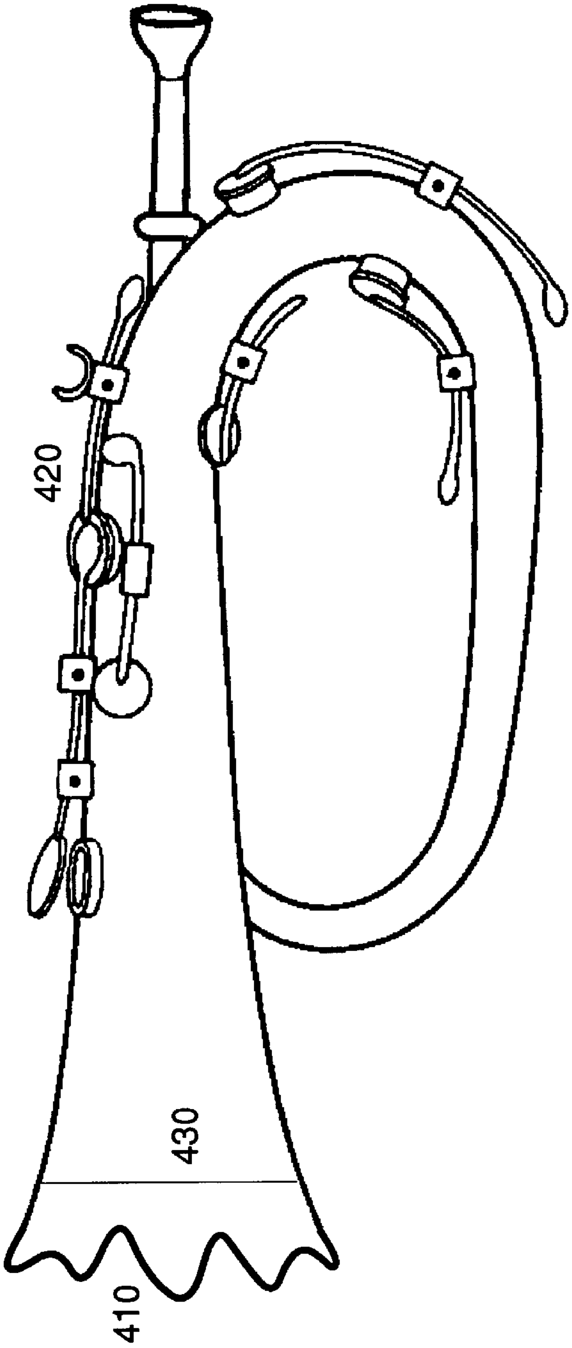
FIG. 4 shows an embodiment of a looped brass instrument with a serrated-roll skirt fabricated in accordance with the present invention.

FIG. 4 shows embodiment 400 of a looped brass instrument with a serrated-roll skirt 410 fabricated in accordance with the present invention. The instrument body 420 is well know to those of ordinary skill in the art. The original skirt is removed by a crosscut 430. The serrated-roll edge skirt 410 joints to the original instrument body at the cut 430 smoothly and continuously. It means that the radii of curvature and a certain number of their derivatives at both sides of the cut 430 are equal to assure any radian curve cross cutting the joint and along the interior wall remain smooth and continuous. Accordance with the present invention, the exterior wall of the skirt 410 may be finished according to the designer's artistic taste. The invented skirt will not only reduce edge diffraction and enrich the tone quality of the brass instrument, but will also make it more visually attractive by the artistically designed edge serration.

Figure 5:
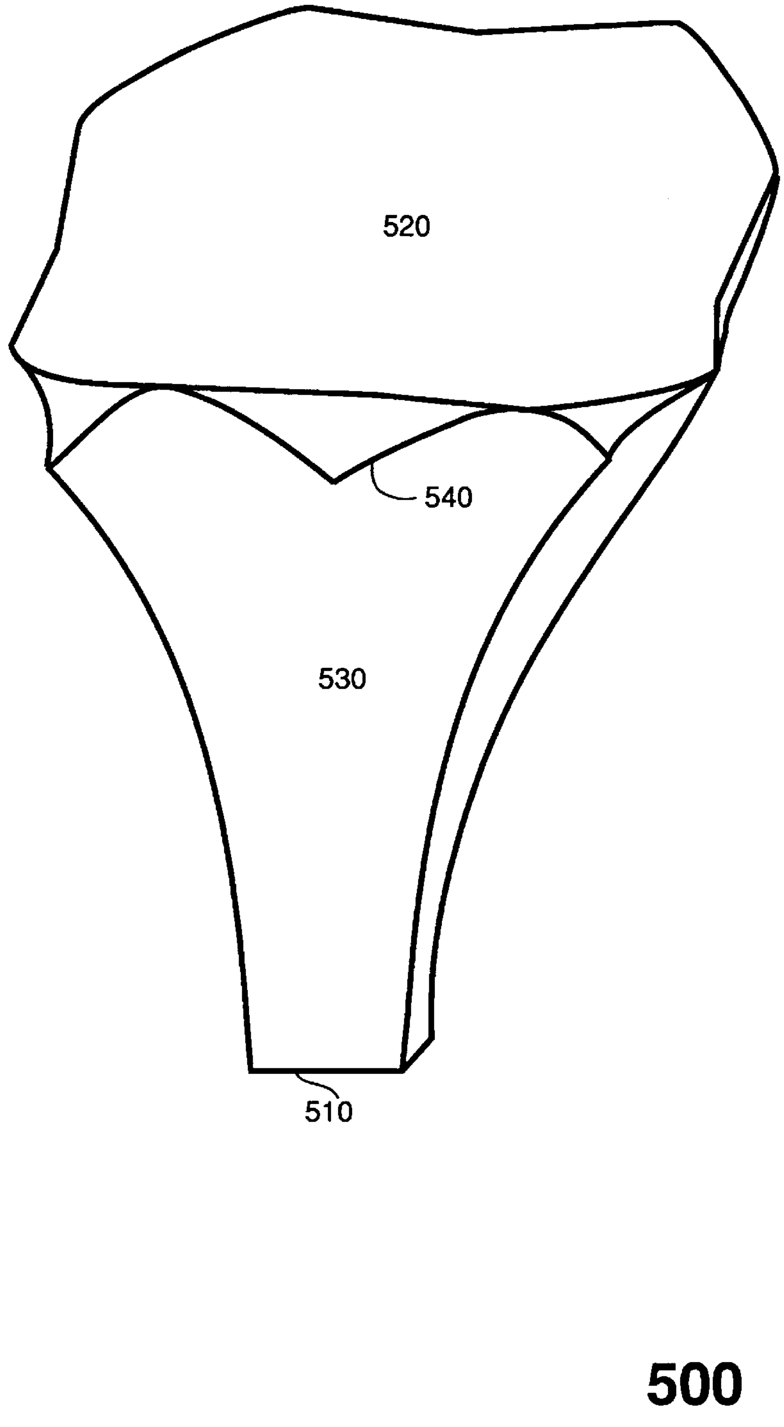
FIG. 5 shows a diagram of a solid skirt with a serrated-roll edge for use in fabricating embodiments of the present invention.

FIG. 5 shows a diagram of a solid skirt 500 with a serrated-roll edge for use in fabricating embodiments of the present invention. Any one with ordinary skills would appreciate the needs of a solid skirt to couple an ultrasonic source with a solid object in the non-destructive testing of materials and in the medical diagnostics. The solid skirt delivers acoustical power to or from an ultrasonic driver through the lower end surface 510, and radiates or receives sounds through the upper end surface 520 to or from environment. Furthermore, any one with ordinary skills should readily appreciate that the solid skirts may take different shapes to satisfy various test and diagnostic objectives. These shapes may be truncated cones and cropped wedges. The exterior wall 530 is serrated and rolled back at the end of the radiating surface 520 to form a serrated-roll edge 540.

Figure 6:
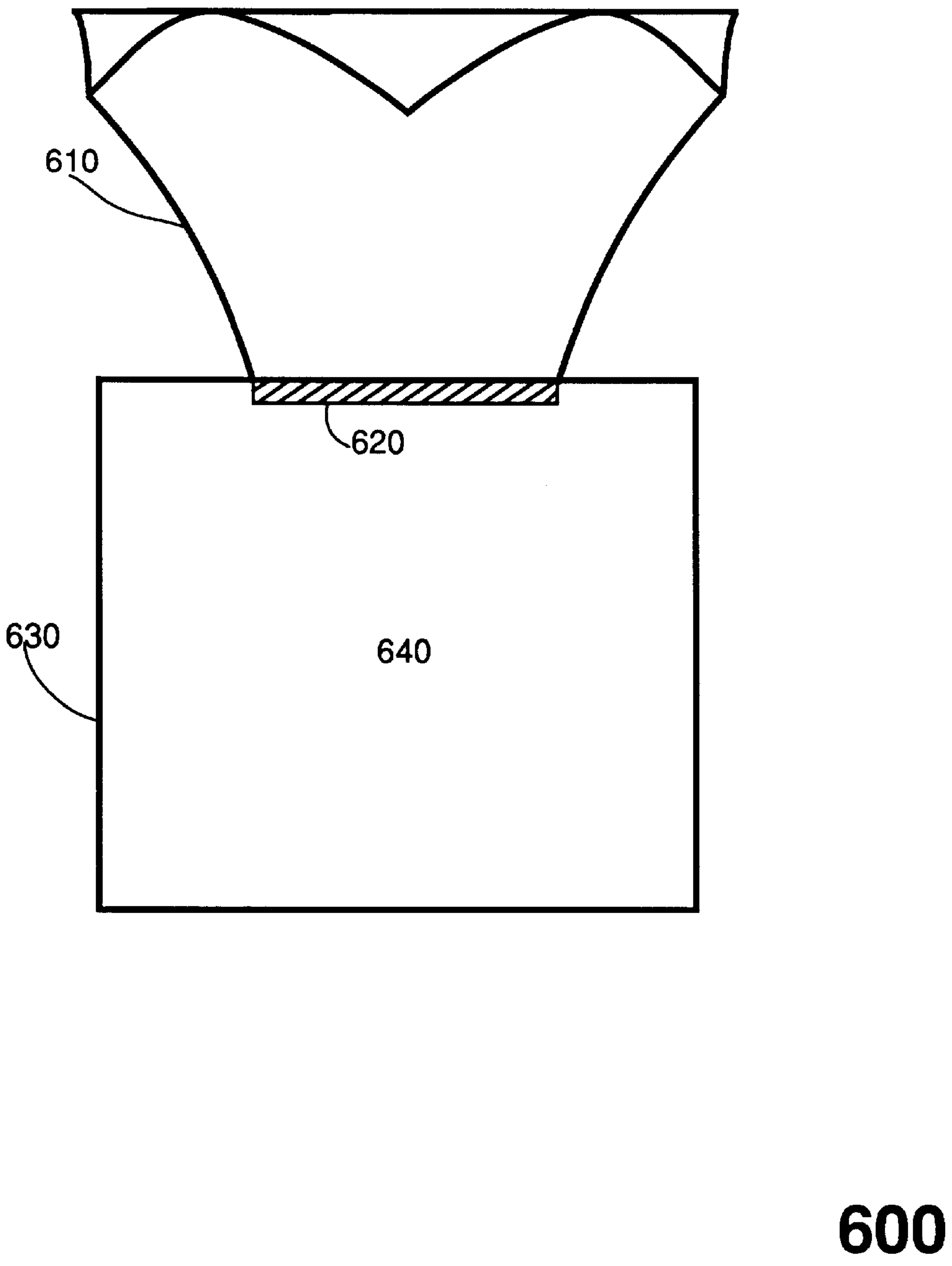
FIG. 6 shows an embodiment of an ultrasonic transducer with a solid serratedroll skirt fabricated in accordance with the present invention.

FIG. 6 shows embodiment 600 of an ultrasonic transducer comprising solid skirt 610 with a serrated-roll edge. Ultrasonic drive 620 is mounted at the receiving end of solid skirt 610. The ultrasonic drive is an apparatus which is well know to those of ordinary skill in the art. The driver might be a piezoelectric plate and its accessories. If it is important to minimize external interference which either comes from the external sources, or from the surrounding environment, then the ultrasonic driver is covered by enclosure 630, which is filled by damping material 640 to reduce internal reflections within the enclosure. The manners, in which the enclosure is installed and the damping material is placed, are well known to those of ordinary skill in the art.

Figure 7:
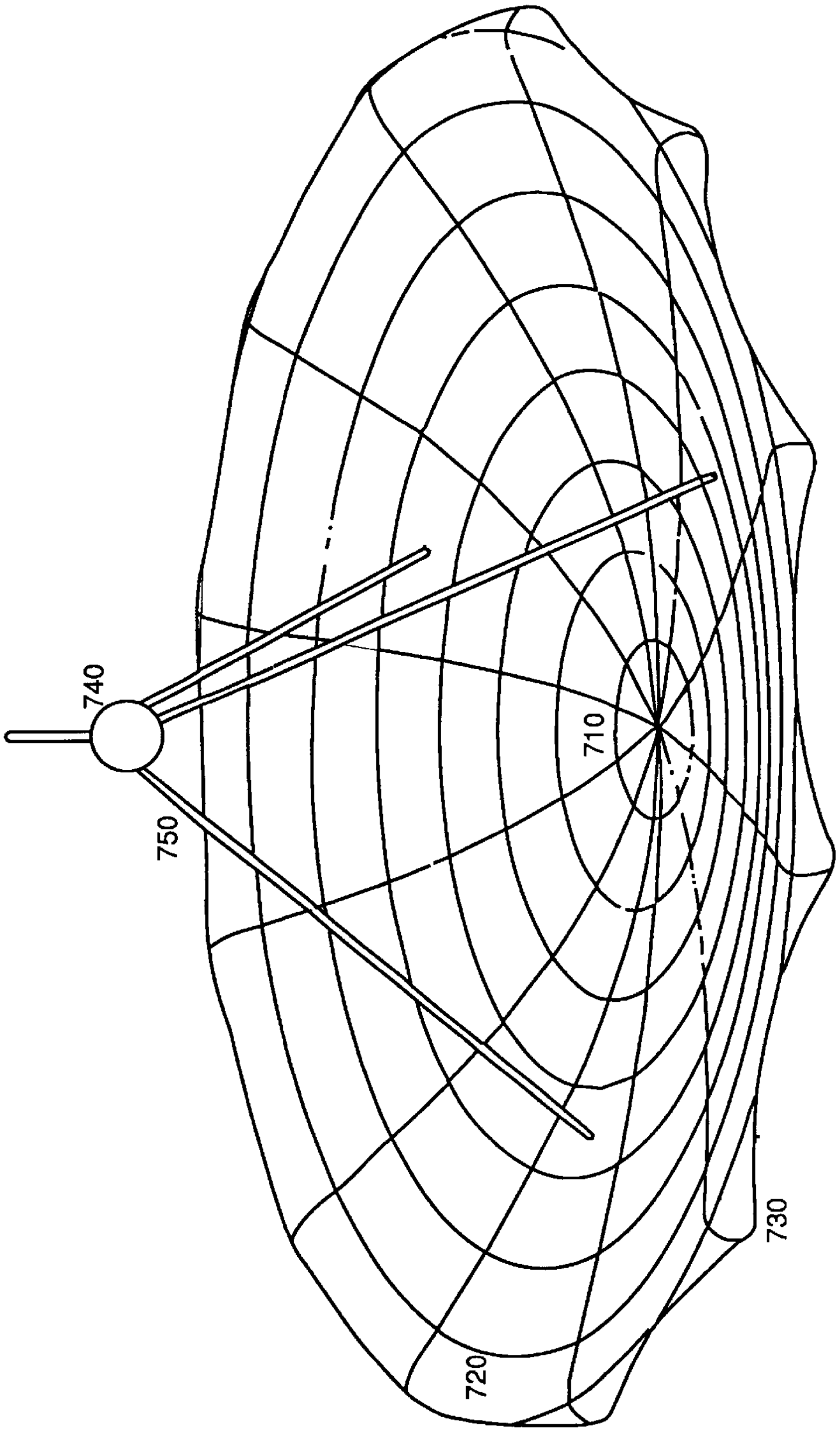
FIG. 7 shows an embodiment of a transducer with a serrated-roll skirt fabricated in accordance with the present invention.

FIG. 7 shows embodiment 700 of a transducer with a serrated-roll skirt fabricated in accordance with the present invention. The transducer can be a loudspeaker, microphone, hydro-speaker, hydro-phone, or an ultrasonic transducer. As those of ordinary skill in the art will readily appreciate, a transducerr with embodiment 700 is highly directional. The transducerr comprises reflector 710, which further comprises skirt 720 with serrated-roll edge 730. The driver 740 of the transducer is mounted above reflector 710 through supports 750. Reflector 710, driver 740, and supports are well known to those of ordinary skill in the art.

OBJECTIVES AND ADVANTAGES

Embodiments of the present invention is a new design to enhance the performance of loudspeakers, microphones, hydro-speakers, hydro-phones, brass and wind instruments, and ultrasonic transducers. The performance enhancement arises from the edge treatment of their openings or end surfaces for reducing side lobe level and sound distribution disturbance. The side lobe and disturbance reductions arising from the present invention 1) enrich the quality of loudspeakers, microphones, and brass and wind instruments; 2) enhance the volume of brass and wind instruments; 3) increase the efficiency and broaden the frequency response of loudspeakers, microphones, hydro-speakers, and hydrophones; 4) reduce the unwanted interference among speakers, hydro-speakers; 5) enhance the low frequency response of woofers; 6) effectively beam acoustical radiations from hydro-speakers and ultrasonic transducers; 7) reduce the vulnerability revealed by hydro-speakers, and increase the selection ability of hydro-phones.

The invented edge will provide better acousducer performance than either of the serrated edge or rolled edge. The invented edge and its host as a whole can be massively manufactured through molding, stamping, and other methods to satisfy the high volume commercial needs on high performance, small in size, and low in cost of loudspeakers, microphones, hydro-speakers, hydro-phones, brass and wind instruments, and ultrasonic transducers.

SUMMARY, RAMIFICATIONS, AND SCOPE

The discussions and drawings given above contain many specifications, they should not be construed as limiting the scope of the invention but merely providing illustrations. Those skilled in the art recognized that further embodiments of the present invention may be made without departing from its teachings. For example, serrated edges with rolls can take many designs and shapes. The serration shape and roll back rate may vary even within a loudspeaker, microphone, hydro-speaker, hydro-phone, brass or wind instrument, or an ultrasonic transducers. Furthermore some portions of the edge for an acousducer may not have a serrated-roll shape. Speakers and phones may be mounted under a surface, the present invention can be implemented through mounting mechanisms as well as on their radome designs.

Thus the scope of the invention should be determined by appended claims and their legal equivalent, rather than by the examples given.

What is claimed is:

1. An acoustical antenna comprising a body; wherein the body comprises a bounded rim which defines an opening for radiating and receiving sounds; wherein the body further comprises of a skirt which is disposed at the rim; wherein a portion of the skirt comprises a serrated-roll edge; wherein the serrated-roll edge is (a) smoothly and continuously rolled back;

(b) shaped to form a serration, wherein an outer edge of the serration is gradual and smooth.

2. The acoustical antenna of claim 1 wherein said skirt provides an extended surface along the rim to the antenna body; wherein the surface being smooth and continuous has a minimum radius of curvature at a part of the extended surface; wherein the minimum radius of curvature has a value which is at least as large as upper end acoustical wave lengths of antenna operation.

3. The acoustical antenna of claim 1 wherein said body and skirt comprise their own respective radii of surface curvature on both sides of the rim; wherein the radii of surface curvature comprise a predetermined number of derivatives; wherein the radii and derivatives of the radii are smooth and continuous across the rim.

4. An acoustical antenna comprises a body; wherein the body comprises a bounded rim which defines an opening for radiating and receiving sounds; wherein the antenna further comprises a skirt which is disposed at the rim; wherein the skirt has a serrated edge and the serrated edge is rolled back to form a serrated-roll edge; wherein an outer edge of the serration is smooth and gradual.

5. The acoustical antenna of claim 4 wherein said body further comprises a mouth; wherein the body further comprises means to mount a transducer at the mouth of the antenna body to interact with the surrounding medium.

6. The acoustical antenna of claim 5 wherein said transducer is housed inside an enclosure; wherein the enclosure comprises means for shielding external inferences to the transducer and for suppressing internal reflections within the enclosure.

7. The acoustical antenna of claim 4 wherein said body forms a reflector; wherein the reflector comprises means to mount a transducer to interact with the surrounding medium.

8. The acoustical antenna of claim 4 wherein said body further comprises a mouth; wherein the body further comprises means to mount a brass instrument at the mouth of the antenna body to radiate sounds.

9. The acoustical antenna of claim 4 wherein said body and skirt comprise solid interiors and rigid exterior walls; wherein the rigid exterior wall of the skirt comprises a serrated-roll edge.

10. The acoustical antenna of claim 9 wherein said body further comprises means to mount an ultrasonic drive to interact with the surrounding medium.

11. A method for improving performance of an acousducer which comprises the steps of:

(a) constructing a smoothly and continuously rolled back skirt with a serratedroll edge;

(b) constructing an antenna body;

(c) disposing the serrated-roll skirt at an opening rim of the antenna body;

(d) radiating and receiving sounds of the acousducer through the antenna body.

12. The method of claim 11 further comprises the steps of:

(e) mounting the acousducer at a mouth of the antenna body;

(f) radiating and receiving sounds of the acousducer through the mouth to the antenna body.

13. The method of claim 12 further comprises the steps of:

(e) enclosing the acousducer by an enclosure.

14. The method of claim 11 further comprises the steps of:

(e) filling the interiors of the antenna body and skirt with solid material;

(f) mounting an ultrasonic drive onto the antenna body;

(g) enclosing the ultrasonic drive by an enclosure.

15. The method of claim 11 further comprises the steps of:

(e) shaping the antenna body to a reflector;

(f) mounting the acousducer in front of the reflector.

16. The method of claim 11 further comprises the steps of:

(e) filling the antenna body and serrated-roll skirt with solid material;

(f) mounting the acousducer at the antenna body on the opposite side to the serrated-roll skirt.

* * * * *